(12) United States Patent
Baurle et al.

(10) Patent No.: US 10,886,870 B2
(45) Date of Patent: Jan. 5, 2021

(54) SINGLE-WIRE BUS MULTI-GROUP FAULT COMMUNICATION FOR HALF-BRIDGE INVERTER MODULES

(71) Applicant: POWER INTEGRATIONS, INC., San Jose, CA (US)

(72) Inventors: Stefan S. Baurle, San Jose, CA (US); Mingming M. Mao, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 66 days.

(21) Appl. No.: 16/343,997

(22) PCT Filed: Oct. 27, 2016

(86) PCT No.: PCT/US2016/059212
§ 371 (c)(1),
(2) Date: Apr. 22, 2019

(87) PCT Pub. No.: WO2018/080508
PCT Pub. Date: May 3, 2018

(65) Prior Publication Data
US 2019/0341870 A1 Nov. 7, 2019

(51) Int. Cl.
*H02P 6/14* (2016.01)
*H02P 29/024* (2016.01)
*G01R 31/34* (2020.01)
*H02P 27/08* (2006.01)

(52) U.S. Cl.
CPC .......... *H02P 29/027* (2013.01); *G01R 31/34* (2013.01); *H02P 27/08* (2013.01)

(58) Field of Classification Search
CPC .................. H02P 24/027; H02P 29/024

USPC .................................................... 318/400.27
See application file for complete search history.

(56) References Cited

U.S. PATENT DOCUMENTS

| | | | |
|---|---|---|---|
| 5,045,988 A | 9/1991 | Gritter et al. | |
| 6,078,173 A | 6/2000 | Kumar et al. | |
| 9,614,465 B2* | 4/2017 | Shriver | F03D 7/0252 |
| 10,181,813 B2* | 1/2019 | Baurle | H02M 1/08 |
| 2012/0163429 A1 | 6/2012 | Rinne et al. | |
| 2016/0065103 A1* | 3/2016 | Glenn | H02P 1/16 318/400.21 |
| 2016/0079846 A1 | 3/2016 | Drummond et al. | |
| 2019/0052216 A1* | 2/2019 | Tanaka | H02P 29/032 |

(Continued)

OTHER PUBLICATIONS

International Patent Application No. PCT-US2016/059212—International Search Report and Written Opinion dated Aug. 3, 2017, 17 pages.

*Primary Examiner* — Erick D Glass
(74) *Attorney, Agent, or Firm* — Christensen O'Connor Johnson Kindness PLLC

(57) ABSTRACT

A fault communication system includes a system controller and a plurality of devices. Each one of the plurality of devices includes a single fault terminal. A fault bus consisting of only a single wire coupled to the system controller and the plurality of devices is also included. The fault bus is coupled to provide multidirectional multi-fault group communication between the plurality of devices and the system controller. The single fault terminal of each one of the plurality of devices includes is coupled to the fault bus to provide the multidirectional multi-fault group communication between the plurality of devices and the system controller.

38 Claims, 4 Drawing Sheets

(56) References Cited

U.S. PATENT DOCUMENTS

2019/0140573 A1\* 5/2019 Baurle ................... H02H 7/122
2019/0372504 A1\* 12/2019 Satou ...................... H02P 27/06

\* cited by examiner

US 10,886,870 B2

SINGLE-WIRE BUS MULTI-GROUP FAULT COMMUNICATION FOR HALF-BRIDGE INVERTER MODULES

CROSS-REFERENCE TO RELATED APPLICATIONS

This application claims priority to International Patent Application No. PCT/US2016/059212, filed on Oct. 27, 2016. International Patent Application No. PCT/US2016/059212 is hereby incorporated by reference.

BACKGROUND INFORMATION

Field of the Disclosure

The present invention relates generally to method and implementation of a fault communication system between multiple switching modules and a system controller for multi-group fault management through a single-wire bus. More specifically it relates to implementation of such the fault communication system in half-bridge inverter modules that may be utilized in 2-phase or 3-phase brushless DC (BLDC) or synchronous motor drives.

Background

Household and industrial appliances such as ventilation fans, cooling systems, refrigerators, dishwasher, washer/dryer machines, and many other white products/goods typically utilize electric motors that transfer energy from an electrical source to a mechanical load. Electrical energy for driving the electric motors is provided through a drive system, which draws electrical energy from an electrical source (e.g., from an ac low frequency source). The electrical energy received from the electrical source is processed through a power converter, and converted to a desired form of electrical energy that is supplied to the motor to achieve the desired mechanical output. The desired mechanical output of the motor may be for example the speed of the motor, the torque, or the position of a motor shaft.

Motors and their related circuitries such as motor drives represent a large portion of network loads. The functionality, efficiency, size, and price of motor drives are challenging and competitive factors that suppliers of these products consider. The function of a power converter in a motor drive includes providing the input electrical signals to the motor such as voltage, current, frequency, and phase for a desired mechanical output load motion (e.g., spin/force) on the motor shaft. The power converter in one example may be an inverter transferring a dc input to an ac output of desired voltage, current, frequency, and phase. Controller of the power converter regulates the energy flow in response to signals that are received from a sensor block. The low power sensed signals from the motor or power converter are sent to the controller in a closed loop system by comparing the actual values to the desired values. The controller adjusts the output in comparison of the actual values to the desired values to maintain the target output.

Brushless dc (BLDC) motors, which are known for their higher reliability and efficiency, are becoming a popular choice in the market replacing brushed dc and ac motors. They are widely used in household appliances, such as refrigerators, air conditioners, vacuum cleaners, washers/driers, and other white goods, and power tools such as electric drills, or other electric tools. A BLDC motor requires a power converter, which typically includes an inverter stage as a combination of half-bridge switcher modules. A half-bridge switcher module may include power switches and a control blocks inside of an integrated circuit, which provides a compact structure having a smaller size and higher efficiency.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
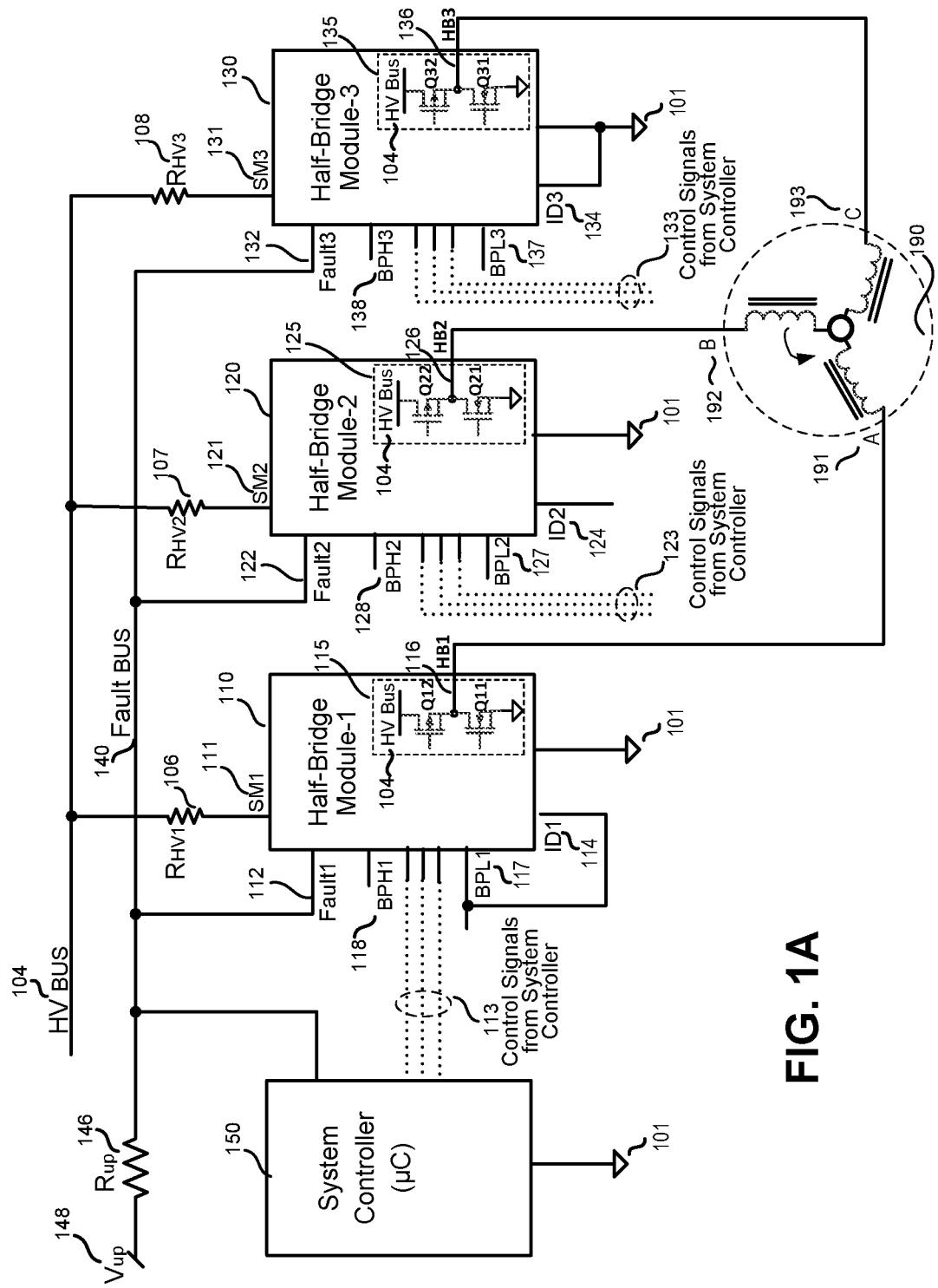
FIG. 1A shows general view of example system level blocks of three half-bridge inverter modules coupled individually to a high voltage bus and controlled by a single system controller in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description specific details are set forth, such as device types, voltages, component values, circuit configurations, etc., in order to provide a thorough understanding of the embodiments described. However, persons having ordinary skill in the relevant art will appreciate that these specific details may not be needed to practice the embodiments described. It is further appreciated that well known circuit structures and elements have not been described in detail, or have been shown in block diagram form, in order to avoid obscuring the embodiments described.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art.

In the context of the present application, when a transistor is in an "off state", or "off", the transistor does not substantially conduct current. Conversely, when a transistor is in an "on state", or "on", the transistor is able to substantially conduct current. By way of example, in one embodiment, a high-voltage transistor comprises an N-channel metal-oxide-semiconductor field-effect transistor (NMOS) with the high-voltage being supported between the first terminal, a drain, and the second terminal, a source. The high voltage MOSFET comprises a power switch that is driven by an integrated controller circuit to regulate energy provided to a load. For purposes of this disclosure, "ground" or "ground potential" refers to a reference voltage or potential against which all other voltages or potentials of an electronic circuit or integrated circuit (IC) are defined or measured.

BLDC motors are becoming increasingly popular in household appliances and power tools. Some of the main reasons why BLDC motors are becoming increasingly popular are due to their higher efficiency and reliability, and less audible noise compared to brushed or universal motors. BLDC motors are typically driven with 2-phase or 3-phase inverters through half-bridge switcher configurations. High voltage (HV) BLDC motors offer better efficiency and lower cost compared to their low voltage (LV) counterparts. The off-line motor drives typically run off of a rectified ac mains (e.g., 325 Vdc bus), or from a power factor correction (PFC) stage output (e.g., a 395 Vdc bus).

Inverters with half-bridge switching configurations are commonly used with motor drives. Instead of implementing a full bridge switching configuration, utilizing a half-bridge switching circuit with low-side and high-side control blocks inside one single package (e.g., a module) allows support for multiphase inverters, such 2-phase and 3-phase inverters, that provide increased layout flexibility as well as simplified thermal management for each module. Utilization of a modular half-bridge circuit structure for a motor drive inverter may reduce overall system cost because of a variety of reasons.

For instance, by utilizing HV JFETs, or through a tap terminal in switcher, a half-bridge module may fully operate self-powered without requiring an additional auxiliary supply. In addition, a half-bridge module coupled as a multi-phase inverter, such as a 2-phase or 3-phase inverter configuration, may operate with a single system controller (μC) to integrate protection features such as HV bus sensing and remote thermal sensing. Moreover, current sensing for controlling the motor and for overcurrent fault protection may also be integrated in a half-bridge switching circuit structure (e.g., through a sense FET), which removes the need for costly external shunt resistors and associated circuitry.

As will be discussed, an efficient process and implementation in order to transfer multi-group fault/error signals through a single-wire fault communication bus in half-bridge inverter modules are disclosed in accordance with the teachings of the present invention. Most devices in the market either use no communication bus or may use standard I2C bus that requires 2 wires. A single-wire interface is disclosed herewith in combination with a multi-grouped fault detection process in accordance with the teachings of the present invention.

As will be shown, examples in accordance with the teachings of the present invention provide reduced pin count usage on a system interface with the system controller (μC). Robust bus arbitration is provided without having to license dedicated addresses, which is required for I2C in most applications in which more devices are to be coupled to the bus. In various examples, every device may take ownership of the bus and become a Master in the event that a new system or device fault detection is to be reported. Typically an I2C bus system only allows an architecture in which there is a fixed single Master and multiple Slaves. As a consequence, in one example, the controlled half-bridge inverter (e.g., switcher) therefore cannot report faults in a Slave until being asked first by the Master, which could present a safety risk due to the delay.

In various examples, a multi-group Fault Digital Word may be utilized, which allows reporting multiple faults at the same time in accordance with the teachings of the present invention. In comparison, alternate simple PWM reporting schemes, that for example use 20%, 40%, 60% or 80% PWM signals to represent each specific fault, require a complex queuing system to transfer PWM fault output of multiple (e.g., three) HB modules to multiple (e.g., three) input terminals of the system controller and thus cannot be bussed. In the various examples, the length of a multi-group Fault Digital Word can easily be adjusted as needed.

In various examples, a single-wire bus communication can be multidirectional to other device(s) on the fault communication bus, whereas in typical simple PWM type of fault communications, only unidirectional signals are allowed. As such, the system μC also has the ability to send commands on the bus, such as status update queries or fault latch resets. In addition, faults can be reported from the controlled switcher devices to the system controller (μC) in accordance with the teachings of the present invention.

The descriptions below explain in detail a fault communication bus and a system/device fault communications based on embodiments of the present disclosure. Even though in example figures and description of the present disclosure it is focused on the application of the single-wire bus multi-group fault communication in the half-bridge inverter modules and specifically with a load example of multi-phase motor drive (in one example BLDC motor), it is understood by someone skilled in the art that the embodiment of the single-wire bus multi-group fault communication system could be used with any multi switching modules or other multi devices controlled by a system controller wherein the multi devices/switching modules by their fault terminals are coupled to the system controller via/through a single-wire fault communication bus. It is also understood that the system controller for switching modules may be in a variety of microcontrollers, microprocessors, digital signal processor (DSP) controllers, or the like.

The possible system level and device level faults in a half-bridge inverter (e.g., a motor driver) may be grouped and prioritized based on their risk, effect on functionality, and the required time of response. In one embodiment, any fault detected through the high-side driver is communicated to the low-side driver in each switching cycle when the low-side switch turns on. The low-side driver is coupled to a fault pin and through a predefined multi-bit word, which in one example is a 7-bit fault word, communicates the fault or status signal through the fault communication bus with the system controller (μC). It is noted that even though examples are described using a 7-bit fault word in this disclosure for explanation purposes, it should not be deemed as limiting, and it is appreciated that other lengths of fault or status word bit-streams may also be utilized in accordance with the teachings of the present invention.

It is also appreciated that there are other circumstances in which a fault communication bus may be utilized to provide multidirectional communications between devices on the bus, such as the system controller and the half-bridge modules in accordance with the teachings of the present invention. For instance, during power up, if startup steps are completed and no fault has occurred, a communication signal indicating a successful power-up may be transmitted through the fault communication bus to the system μC to indicate the readiness for steady state operation. In addition, if at any time a restart is required, such as for example after a latching thermal shutdown has occurred, the system controller may send a fault latch reset command through the fault communication bus. It is also appreciated that the fault communication bus may include an open drain configuration, which in one example may be pulled up through a pull up resistor to a supply voltage.

FIG. 1A shows an example of system level blocks of a multiphase motor drive system including three half-bridge inverter modules coupled individually to an HV bus and controlled with a single system controller to drive a multiphase motor, such as for example a 2-phase or 3-phase motor, in accordance with the teachings of the present invention. As will be shown, a multidirectional multi-fault group communication may be communicated between devices on the fault communication bus, such as the half-bridge inverter modules to and from the system controller through a single wire fault communication bus in accordance with the teachings of the present invention. For instance, in various examples, the multi-fault group communication between the half-bridge inverter modules and the system controller may categorize those faults that cannot occur at the same time under one group. These faults as well can be reported together as one group. For instance, the faults: over voltage warning, multi-level under voltage warning, device or system level high temperature warning, and/or shutdown and over current warning in either the high-side or low-side switch could be categorized under four groups of A, B, C, and D as shown in Table 1 below. These fault warnings are coupled to be reported by encoding through a multi-bit fault word to transfer over the single-wire fault communication bus to the system controller that may result in commands from the system controller (e.g., microcontroller) to protect the system (by either control parameter change, latching the operation, or shutdown). In addition, the system controller may also mutually communicate status request updates, or send unlatch commands through the fault bus in accordance with the teachings of the present invention.

As shown, the system monitor terminals SM1 111 of half-bridge module-1 110, SM2 121 of half-bridge module-2 120, and SM3 131 of half-bridge module-3 130 are each individually coupled to the HV bus 104 through resistors RHV1 106, RHV2 107, and RHV3 108, respectively. In each half-bridge module, the half-bridge mid-point terminals HB1 116, HB2 126, and HB3 136 from switching blocks 115, 125, and 135 are respectively coupled to the three phase terminals A 191, B 192, and C 193 of a multiphase motor 190. In one example, motor 190 is a brushless 3-phase DC motor, which may be included in for example an electric appliance, power tool, or the like. In the depicted example, terminals BPH1 118, BPH2 128, and BPH3 138 are supply terminals to the high-side controllers of half-bridge modules 110, 120 and 130 respectively. Similarly, BPL1 117, BPL2 127, and BPL3 137 are supply terminals to the low-side controllers of half-bridge modules 110, 120 and 130 respectively.

The half-bridge module-1 110, half-bridge module-2 120, and half-bridge module-3 130 each have a single identification terminal ID1 114, ID2 124, or ID3 134, respectively, that is configured to be in a unique predefined address to uniquely identify the respective half-bridge module on the fault communication bus. As such, in various examples status updates transferred from each half-bridge module can therefore be differentiated to uniquely identify the respective half-bridge module, and allow the system controller to respond accordingly to the fault signals that are reported from each specific half-bridge module. For instance, in one example there are three half-bridge modules, each single identification terminal of half-bridge module may be a three-state terminal, and is uniquely coupled to a predefined one of a ground terminal 101 (e.g., a "low" logic state as shown for ID3 134), the low side supply terminal BPL1 117 (e.g., a "high" logic state as shown for ID1 114), or may be left floating (e.g., a "high impedance" state as shown for ID2 124).

As shown in the depicted example, there are groups of control signals 113 to half-bridge module-1 110, control signals 123 to half-bridge module-2 120, and control signals 133 to half-bridge module-3 130 coupling each half-bridge module to system controller 150. In one example, the fault signals from terminal Fault1 112 of the half-bridge module-1 110, the fault signals from terminal Fault2 122 of the half-bridge module-2 120, and the fault signals from terminal Fault3 132 of the half-bridge module-3 130 are each coupled to a single-wire fault communication bus 140, which is also coupled to the system controller 150. Fault communication bus 140, which in one example is an open collector configuration, is coupled to a supply voltage Vup 148 through a pull up resistor Rup 146. In one example, the fault communication bus 140 in normal steady state condition is pulled up to supply voltage Vup 148, and during any fault condition may be pulled down for detection of a fault type through a digital multi-bit fault word in accordance with the teachings of the present invention.

Figure 1B:
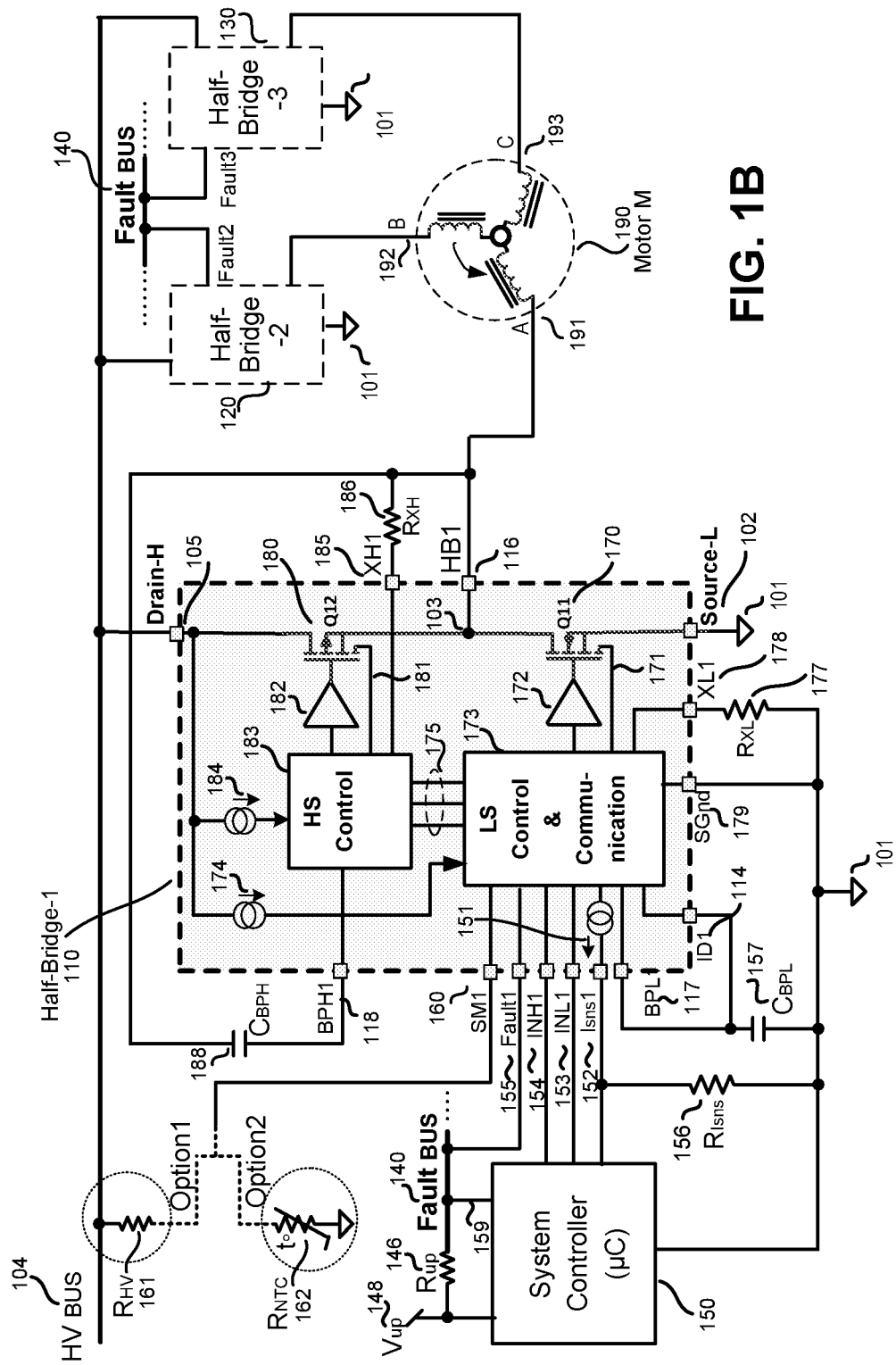
FIG. 1B shows and example illustrating increased detail of the switching devices and control blocks inside a half-bridge inverter module and related signals in accordance with the teachings of the present invention.

FIG. 1B is a diagram that provides increased detail of example control blocks and their signals included in one of the half-bridge modules (i.e., half-bridge module-1 110). It is appreciated that details of the other half-bridge modules, (i.e., half-bridge module-2 120 and half-bridge module-3 130) although present, are not shown in detail so as to avoid obscuring the teachings of the present invention. In addition, the details of the couplings of the three half-bridge modules to the three-phase Motor 190 is as illustrated in FIG. 1A, and are therefore simplified in FIG. 1B. The Fault terminals from each of the three half-bridge modules are coupled through the single-wire system level fault communication bus 140 to the system controller 150.

In half-bridge module-1 110, half-bridge switching includes high-side MOSFET switch Q12 180 and low-side MOSFET switch Q11 170, which are coupled in series. High-side Drain-H 105 is coupled to the HV bus 104, and the low-side Source-L 102 is coupled to system ground 101. The half-bridge mid-point 103 is coupled to phase A 191 of motor M190 through terminal HB1 116. In one example, switch Q11 170 and switch Q12 180 may include current sensing through sense FET terminals 171 and 181, respectively.

MOSFET switch Q11 170 is coupled to gate driver 172 and receives gating signals from low-side LS control and communication block 173. MOSFET switch Q12 180 is coupled to gate driver 182 and receives gating signals from high-side HS control block 183. The logic level gating signals are generated inside the system controller 150 in response to the sensed signals in LS control 173 or in HS control 183, which are communicated/transferred through communication links 175 between HS control 183 and LS control and communication block 173. In one example, low side logic level gating signal INL1 153 and high side logic level gating signal INH1 154 are calculated in system controller 150 in response to the received sensed current Isns1 152 from LS control and communication block 173. The low side logic level gating signal INL1 153 to control LS switch Q11 170 is processed in LS control and communication block 173, and the high side logic level gating signal INH1 154 to control HS switch Q12 180 is communicated through communication links 175 to the HS control 183 to generate gating/control signal for the high-side switch Q12 180.

In one example, the maximum current (i.e., current limit) of the low-side switch Q11 170 and high-side switch Q12 180 are set by external resistors RXL 177 and RXH 186, which are coupled to terminals XL1 178 and XH1 185, respectively. Current limit resistor RXL 177 is referenced to system ground, and current limit resistor RXH 186 is referenced to the half-bridge mid-point 103, which is coupled to terminal HB1 116 and is the return reference for the HS control.

The instantaneous sensed current of LS switch (e.g., as through the sense FET) is processed in LS control and communication block 173 to provide the sensed current signal illustrated as a single-pin current supply 151 on terminal Isns1 152. Current signal Isns1 152 across resistor RIsns 156 generates a voltage signal to the system controller 150 that represents sensed/monitored current in the LS switch. In one embodiment, any over current fault in the HS switch is reported to the LS control and communication block 173 through communication links 175, only during the next switching cycle that LS switch is turned on. It is appreciated that even though high-side and low-side over current faults cannot happen at the same time, they can be reported simultaneously. Thus, in accordance with the teachings of the present invention, only a single terminal Isns1 152 on each switching module is sufficient to report both of the switching current events in the HS and LS switches to the system controller.

In one example the LS and HS control blocks could be self-supplied, such as for example during startup, through current supplies 174 and 184, and in one example through the high-side drain coupled to Drain-H 105 (e.g., from a tap terminal). During normal operation, the internal supplies of the LS control and communication block 173 and HS control 183 are provided through terminals BPL1 117 and BPH1 118 respectively. The high-side supply terminal BPH1 118 is referenced to the half-bridge point HB1 116 through a boot-strap capacitor CBPH 188.

As mentioned above each half-bridge module is identified by ID terminal being pulled high to the low-side supply terminal, or being pulled low to system ground 101, or by leaving it floating. For instance, in FIG. 1B the identification terminal ID1 114 of the module half-bridge-1 110 is pulled up with the coupling to low-side supply terminal BPL1 117, which is capacitively coupled to system ground 101 across a capacitance CBPL 157. The low-side source, Source-L 102 and signal ground SGnd 179 of the half-bridge module 110 are also coupled to the system ground 101.

Figure 2:
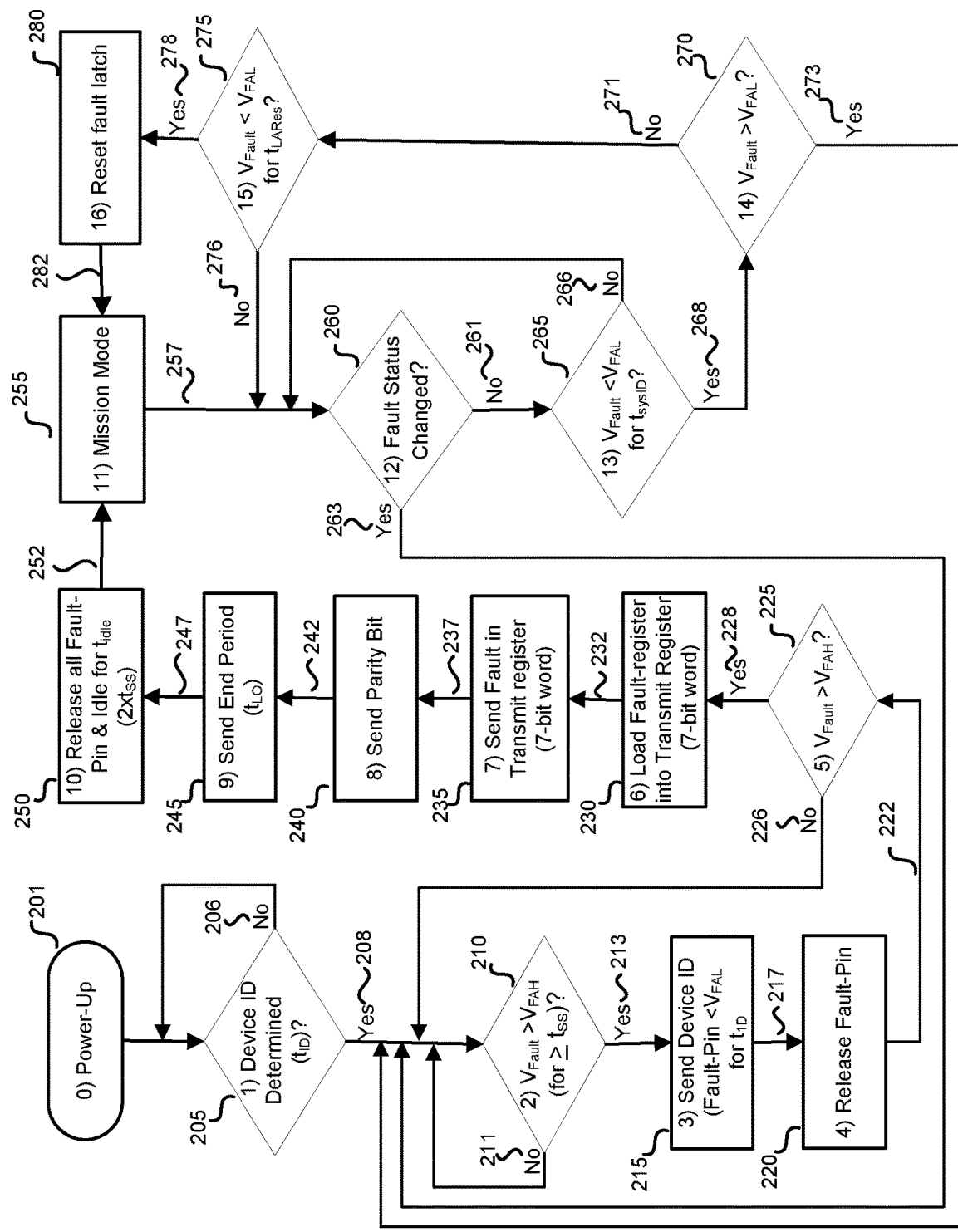
FIG. 2 shows a flow chart illustrating an example process of communications through a fault communication bus in accordance with the teachings of the present invention.

FIG. 2 is an illustration of flow chart that shows an example of a communication process through a fault communication bus in accordance with the teachings of the present invention that could be initiated for one of three reasons: (1) when system is ready for a mission mode communication after a successful power up/startup; (2) when a fault status register change communication has been initiated; and (3) when system controller has initiated a status update query or fault latch reset.

A shown, flow chart of FIG. 2 explains the process to detect and respond to the reported faults or status report from each half-bridge module through the single-wire fault communication bus 140 to the system controller 150. After the start-up process block 0 201, a signal for device ID determination of the half-bridge module is detected. In process block 1 205 the output "No" 206 keeps the process pending until the device ID is determined depending on detection of ID terminal (e.g. low/high/floating) during bus arbitration in a time interval $t_{ID}$ (312 in FIG. 3). This allows the system controller to distinguish between 3 different half-bridge modules.

As soon as the device ID is determined, and the output from process block 1 205 is "Yes" 208, the process proceeds to conditional process block 2 210. In conditional process block 210, if fault communication bus voltage $V_{Fault}$ has not remained higher than fault communication bus high threshold $V_{FAH}$ for a predetermined time duration $t_{ss}$, the output "No" 211 from conditional process block 210 keeps the loop waiting. Device will only attempt to communicate a status update after the bus has been idle ($V_{Fault}>V_{FAH}$) for at least a time interval $t_{ss}$. This allows other devices (e.g., with shorter $t_{ID}$) to communicate on the bus as well. If $V_{Fault}>V_{FAH}$ for longer than $t_{ss}$, the output "Yes" 213 from conditional process block 210 proceeds to process block 3 block 215, and sends the device ID (e.g., output 217) in the form of a pull-down period with a duration of $t_{ID}$, while the fault pin voltage remains less than the low threshold of fault voltage ($V_{Fault}<V_{FAL}$) for a duration of $t_{ID}$.

Figure 3:
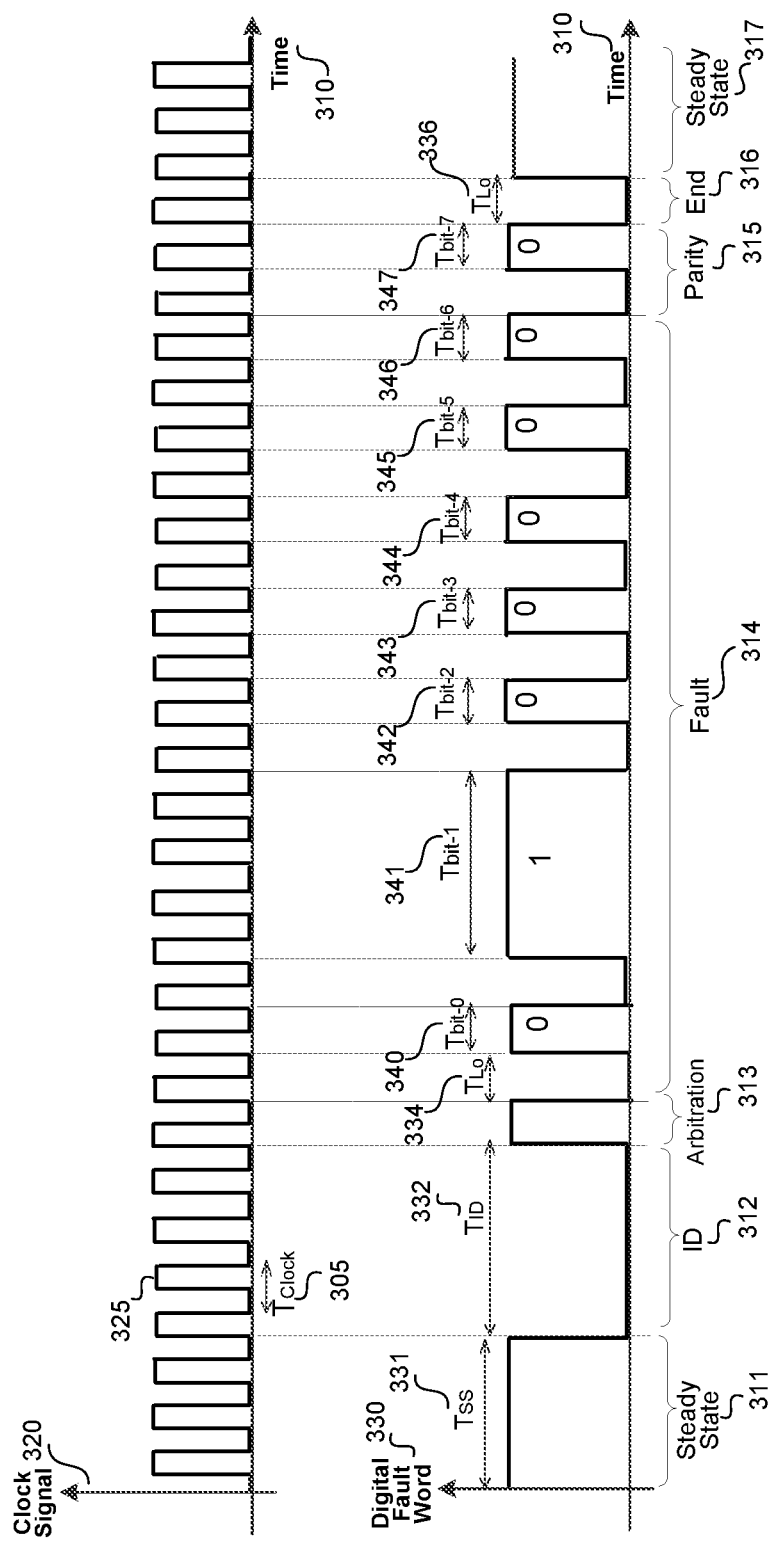
FIG. 3 shows an example timing diagram of clock pulses and an example bit stream presenting a 7-bit fault word in accordance with the teachings of the present invention.

Then, in process block 4 220 the fault-pin is released. Link 222 process block 4 220 proceeds to another conditional process block 5 225, which checks again if $V_{Fault}>V_{FAH}$. If the fault-pin voltage is still less than the high threshold of fault voltage $V_{FAH}$, the output "No" 226 from conditional process block 5 225 proceeds back to conditional process block 2 210 to assure that the device ID is fully detected and no other device (e.g., with a longer $t_{ID}$) has started communication at the same time. In this case, the device with the shorter ID time $t_{ID}$ has to wait and restart the communication at a later time (jumping back to block 2, 210). If the device ID is fully detected and $V_{Fault}>V_{FAH}$ (i.e., the output "Yes" 228 from conditional process block 5 225), the fault register is loaded into the 7-bit word of transmit register in process block 6 230, and then link 232 proceeds to process block 7 235. Process block 7 235 shows that the 7-bit fault word is sent to a register, and then link 237 shows that a parity bit is then sent in process block 8 240. Link 242 shows that in process block 9 245, the "End" signal is sent, which as will be shown in FIG. 3 is indicated with period $t_{Lo}$.

After sending the whole fault word, link 247 continues to process block 10 250, where the fault pin is released and idled for a time period $t_{idle}$, which in one example may be ~2×$t_{ss}$. Line 252 continues to process block 11 255, in which mission mode starts to supervise fault status and fault communication. Link 257 continues to conditional process block 12 260 to check whether there is a fault status change. If there is any status change in fault, the output "Yes" 263 continues processing back to conditional process block 2 210, where the condition of the fault voltage is compared to high threshold of fault voltage for the time period $t_{ss}$. On the other hand, as long as there is no change in the fault status, the output "No" 261 continues to conditional process block 13 265, where the fault pin voltage is compared to the low threshold of fault voltage $V_{FAL}$, for a time period $t_{sysID}$. It is appreciated that this part of process checks if the system controller is sending either a status query or a latch reset command. If the fault pin voltage has not yet decreased below the $V_{FAL}$, the output "No" 266 continues back to the conditional process block 12 260 to check status of the fault change. However, if the fault pin voltage has decreased below the low threshold of fault voltage $V_{FAL}$ for a time period $t_{sysID}$, the output "Yes" 268 continues to conditional process block 14 270, where the fault pin voltage is compared with the low threshold of fault voltage $V_{FAL}$.

As long as the fault pin voltage has not increased above the low threshold of Fault voltage $V_{FAL}$, the output "No" 271 loops back processing to conditional block 15 275 such that the process remains in a closed loop (checking if the fault pin voltage remains below the $V_{FAL}$ for a long enough time period of $t_{LARes}$ to reset the latch). If this condition is not satisfied, the output "No" 276 repeats processing back to conditional process block 12 260 to check for any status change in the fault signal. However, if this condition is satisfied and fault pin voltage remains below the $V_{FAL}$ for an entire period of $t_{LARes}$, the output "Yes" 278 continues process block 16 280, where the latch is reset/removed by command of µC. Link 282 then continues the fault supervision loop back to the mission mode process block 11 255. However, if the conditional process block 14 270 outputs "Yes" 273, which constitutes a status query command received from the system controller, in the case that the fault-pin voltage increases again above the low threshold of fault voltage $V_{FAL}$, the process repeats back to conditional process block 2 210 to repeat the loop of checking/comparing the fault-pin voltage versus the low and high thresholds ($V_{FAH}$ and $V_{FAL}$) of the fault-pin voltage as explained above.

Table 1 below presents some examples of a 7-bit Fault words encoding for some of the possible faults and errors that may occurs in the device level and the system level of half-bridge inverter modules in a three-phase motor driver in accordance with the teachings of the present invention.

Group A includes HV bus over-voltage and under-voltage faults plus the system thermal fault, which can be reported together as they cannot occur at the same time. These faults are presented by the first 3 bits of the fault 7-bit word as presented in Table 1.

Group B presents the low-side (LS) driver fault that may include faults of LS current limit (XL pin) open or its short circuit to the current sense pin $I_{sns}$. It also covers the trim-bit corruption report. Group B is encoded by logic high (1) of Bit0, Bit1 and Bit2. It is appreciated that the high-side (HS) FET over current fault can only be reported when the low-side (LS) FET has turned on. Thus, the over current fault of HS FET and LS FET can be reported together as one single fault group, even though they are faults that do not occur simultaneously.

Group C includes LS FET thermal warning and thermal shutdown faults plus the high-side driver fault including HS to LS communication loss, high side supply excessive rail voltage and the high side current limit, XH-pin open/short circuit fault. These faults as well can be reported together as they cannot occur at the same time. Bit3 and Bit4 of the fault 7-bit word are used for Group C faults encoding.

Group D includes low-side and high-side FET over current fault detection, which are presented by Bit5 and Bit6 of the fault 7-bit word respectively going to logic high (i.e., 1).

Group E fault register entry is used for the normal operation with no fault and is encoded by all bits of the fault 7-bit word on zero short pulses ("000 00 0 0") communicating with system controller to report the Ready Status of device (e.g., after a successful power up).

FIG. 3 shows a timing diagram of clock pulses and an example bit stream in which a multi-bit digital fault word includes pulse width modulated (PWM) logic level pulses to encode the multi-bit digital fault word into binary. In the depicted example, the multi-bit digital fault word is presenting a 7-bit fault word "010 00 0 0", which according to Table 1 may present an HV bus under-voltage fault condition of 100%.

The upper graph in FIG. 3 shows the internal system clock signals 325 on vertical axis 320 versus time 310 on the

TABLE 1

Example of system and device level fault categories and a 7-bit fault word encoding

| Category | Fault and Parameter | Bit 0 | Bit 1 | Bit 2 | Bit 3 | Bit 4 | Bit 5 | Bit 6 |
|---|---|---|---|---|---|---|---|---|
| A | HV Bus OV; $I_{OV}$ | 0 | 0 | 1 | 0 | 0 | 0 | 0 |
| A | HV Bus UV 100%; $I_{UV100}$ | 0 | 1 | 0 | 0 | 0 | 0 | 0 |
| A | HV Bus UV 85%; $I_{UV85}$ | 0 | 1 | 1 | 0 | 0 | 0 | 0 |
| A | HV Bus UV 70%; $I_{UV70}$ | 1 | 0 | 0 | 0 | 0 | 0 | 0 |
| A | HV Bus UV 55%; $I_{UV55}$ | 1 | 0 | 1 | 0 | 0 | 0 | 0 |
| A | System Thermal; $V_{Th(TM)}$ | 1 | 1 | 0 | 0 | 0 | 0 | 0 |
| B | LS Driver Fault | 0 | 0 | 0 | 0 | 1 | 0 | 0 |
| C | LS FET (Thermal Warning); $T_{WA}$ | 0 | 0 | 0 | 0 | 1 | 0 | 0 |
| C | LS FET (Thermal Shutdown); $T_{SD}$ | 0 | 0 | 0 | 1 | 0 | 0 | 0 |
| C | HS Driver Fault; $I_{Com}$ | 0 | 0 | 0 | 1 | 1 | 0 | 0 |
| D | LS FET Over Current; $V_{X(Th)}$ | 0 | 0 | 0 | 0 | 0 | 1 | 0 |
| D | HS FET Over Current | 0 | 0 | 0 | 0 | 0 | 0 | 1 |
| E | No Fault (Ready) | 0 | 0 | 0 | 0 | 0 | 0 | 0 |

The example faults shown in Table 1 above include five categories, in which faults that do not occur at the same time are grouped together. This feature enables reporting of multiple faults to the system µC at the same time without concerning fault priorities or fault-reporting queue.

horizontal axis. In one example, each clock cycle has a period $T_{Clock}$, 305, which in one example is 10 µs, which corresponds to a frequency of 100 kHz. The lower graph in FIG. 3 illustrates the bit stream communication on the fault bus. The "Digital Fault Word" on vertical axis 330 illustrates an example of logic levels and timing that encodes a 7-bit digital fault word for an under voltage error of 100%, as defined in Table 1 above.

In one example, before a 7-bit digital fault word communication begins, the communication is started with transmitting the respective device ID. In one example, the device ID of each half-bridge inverter module may be predefined and differentiated by either pulling the respective ID-pin down to the Ground reference (Gnd), by pulling the respective ID-pin up to the low-side supply voltage $V_{BPL}$, or by leaving the respective ID-pin floating, as described above in the example illustrated FIG. 1B. Fault communications always start after a steady state condition (e.g., a quiet or idle condition) 311 when the fault bus voltage $V_{FAULT}$ has remained higher than the fault high threshold $V_{FAH}$ (i.e., $V_{FAULT} > V_{FAH}$) for at least a steady state timing duration of $t_{SS}$ 331 (e.g., $t_{SS}$=80 μs).

Fault communications begin with an identification period 312 in a time period $t_{ID}$ 332, during which the device ID is detected by the system controller (e.g., microcontroller or MCU), and is followed by a signal-high period 313 for arbitration. For instance, in one example, the device ID may be determined in response to the predefined state that the respective ID terminal is coupled as described above (e.g., the ID terminal of the half-bridge inverter module configured in a logic "high", a logic "low", or a floating/open circuit as a "high impedance" coupling). When a device is identified or determined after the arbitration period on the fault bus, that device is configured to take control of the fault bus, and then begins the transfer of the 7-bit fault word on the fault bus. First, the fault bus is pulled low for a period $t_{Lo}$ 334 before the main bit stream of Fault 314 begins. As shown, it is appreciated that the "1" bits are encoded with a long period of high-signal, while the "0" bits are encoded with a short period of high-signal, which are separated and differentiated from each other by short time periods of low (i.e., pulled down) signals.

In one example of encoding and decoding of 7-bit digital fault word, each zero (0) is presented by a short interval $t_{(BIT0)}$=10 μs of a high-signal, and each one (1) is presented by a long interval $t_{(BIT1)}$=40 μs of high-signal. The high-signal pulses are always separated, or differentiated from each other, by pull-down intervals of $t_{LO}$=10 μs. In other words, a relatively short logic high pulse followed by a short low pulse indicates a logic zero, and a relatively long logic high pulse followed by the short logic low pulse indicates a logic one in the 7-bit digital fault word.

At the end of the 7-bit digital fault word, a parity bit is generated that may be either "1" or "0" so that the total number of the "1" bits in the Fault word could always remain an odd number, or in another example always remain an even number. For instance, in the illustrated example, the total number of the "1" bits in the Fault word is kept odd. In other words, if the fault word has even number of bits valued "1", the parity bit should be "1" and if the fault word has odd number of bits valued "1" the parity bit should be "0". Thus, in the 7-bit fault word example of FIG. 3, the parity bit is selected "0" to keep a total of odd number for the bits valued "1". A parity bit is followed by a short interval/period $t_{LO}$ 336 (e.g., $t_{LO}$=10 μs) of pull-down to present an "End" 316 of the communication on the fault bus before resuming normal operation in steady state 317, in which the fault bus voltage $V_{Fault}$ remains continuously at a high level (e.g., at the $V_{up}$ supply level).

Persons of skill in the art will understand that the disclosed subject matter may be implemented by different versions and varieties. Switching device may consist of any discrete or integrated Si, SiC, GaN or other types of high electron mobility semiconductor switches.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example currents, voltages, resistances, device sizes, etc., are provided for explanation purposes and that other values may also be employed in other embodiments and examples in accordance with the teachings of the present invention.

What is claimed is:

1. A fault communication system, comprising:
a system controller;
a plurality of devices, wherein each one of the plurality of devices includes a single fault terminal; and
a fault bus consisting of only a single wire coupled to the system controller and the plurality of devices, wherein the fault bus is coupled to provide multidirectional multi-fault group communication between the plurality of devices and the system controller, wherein the single fault terminal of each one of the plurality of devices is coupled to the fault bus to provide the multidirectional multi-fault group communication between the plurality of devices and the system controller.

2. The fault communication system of claim 1, wherein each one of the plurality of devices includes an identification terminal coupled to uniquely identify each respective one of the plurality of devices through a predefined identification state of each respective identification terminal of each one of the plurality of devices.

3. The fault communication system of claim 2, wherein the predefined identification state for each respective one of the plurality of devices is coupled to be transmitted at a start of each fault bus communication period to identify said respective one of the plurality of devices on the fault bus.

4. The fault communication system of claim 3, wherein said respective one of the plurality of devices that is identified at the start of each fault bus communication period is coupled to take control of the fault bus after being identified.

5. The fault communication system of claim 1, wherein the single fault terminal of each one of the plurality of devices is coupled to communicate device level and system level status or fault information in each respective one of the plurality of devices as a multi-bit digital fault word between the plurality of devices and the system controller on the fault bus.

6. A half-bridge switching module for use in a fault communication system, wherein the half-bridge switching module is one of a plurality of half-bridge switching modules coupled to an input voltage to generate a desired output to a load in response to a system controller, wherein the half-bridge switching module comprises:
a low-side switch;
a low-side control circuit coupled to control the low-side switch, wherein the low-side control circuit is referenced to a low-side reference ground;
a high-side switch coupled to the low-side switch;
a high-side control circuit coupled to control the high-side switch, wherein the high-side control circuit is coupled to be referenced to a floating node of the half-bridge switching module;

a single fault terminal coupled to a fault bus consisting of only a single wire coupled to the system controller to provide multidirectional multi-fault group communication between the plurality of the half-bridge switching modules and the system controller.

7. The half-bridge switching module of claim 6, further comprising a single identification terminal coupled to be in a predefined state to uniquely identify the half-bridge switching module on the fault bus at a start of each fault bus communication.

8. The half-bridge switching module of claim 7, wherein half-bridge switching module is coupled to take control of the fault bus after being identified at the start of each fault bus communication.

9. The half-bridge switching module of claim 6, wherein the system controller is one of a microcontroller, microprocessor, or a digital signal processor controller.

10. The half-bridge switching module of claim 6, further comprising a mid-point terminal coupled between the high side switch and the low side switch, and coupled to one phase of an ac multi-phase load.

11. The half-bridge switching module of claim 10, wherein the ac multi-phase load is a multiphase motor, wherein the mid-point terminal is coupled to respective phase terminal of the multiphase motor.

12. The half-bridge switching module of claim 11, wherein the multiphase motor is a brushless DC motor.

13. A fault communication system for use with a plurality of half-bridge inverter modules, comprising:
  a fault bus consisting of only a single wire;
  a system controller coupled to the fault bus; and
  wherein the plurality of half-bridge inverter modules coupled to an ac load in response to the system controller, wherein each one of the plurality of half-bridge inverter modules comprises:
  a single fault terminal coupled to the fault bus to provide multidirectional multi-fault group communication between the plurality of half-bridge inverter modules and the system controller;
  a switching block including a high side switch coupled to a low side switch, wherein a mid-point terminal between the high side switch and the low side switch is coupled to a respective phase terminal of the multiphase load; and
  a single identification terminal configured to be in a predefined state for a respective one of the plurality of half-bridge inverter modules to uniquely identify said respective one of the plurality of half-bridge inverter modules on the fault bus.

14. The fault communication system of claim 13, wherein the system controller is a microcontroller.

15. The fault communication system of claim 13, wherein the plurality of half-bridge inverter modules are coupled to drive a multiphase motor.

16. The fault communication system of claim 13, wherein the multiphase motor comprises a 3-phase motor drive coupled to be driven in response to the system controller and the plurality of half-bridge inverter modules.

17. The fault communication system of claim 13, wherein the single fault terminal of each one of the plurality of half-bridge inverter modules is coupled to communicate device level and system level status or fault information as a multi-bit digital fault word between the plurality of half-bridge inverter modules and the system controller on the fault bus.

18. The fault communication system of claim 17, wherein the predefined state for said respective one of the plurality of half-bridge inverter modules is coupled to be transmitted at a start of each fault bus communication to identify said respective one of the plurality of half-bridge inverter modules on the fault bus.

19. The fault communication system of claim 18, wherein said respective one of the plurality of half-bridge inverter modules that is identified at the start of each fault bus communication is coupled to take control of the fault bus after being identified.

20. The fault communication system of claim 13, wherein the multi-fault group communication between the plurality of half-bridge inverter modules and the system controller includes one of: an over voltage fault warning, a multi-level under voltage fault warning, a device or system level high temperature fault warning, and/or shutdown and over current fault warning in the high-side or low-side switch.

21. The fault communication system of claim 20, wherein the multi-fault group communication is coupled to be reported over the fault bus by encoding a multi-bit digital fault word to cause a control parameter change, latching, or shutdown in the system controller.

22. The fault communication system of claim 20, wherein the system controller is coupled to mutually communicate status request updates, or send unlatch commands through the fault bus.

23. The fault communication system of claim 20, wherein the device level or system level faults detected by the plurality of half-bridge inverter modules are categorized into fault groups that are reported over the fault bus, wherein a fault group may contain faults that do not occur simultaneously.

24. The fault communication system of claim 21, wherein the multi-bit digital fault word comprises pulse width modulated (PWM) logic level pulses to encode the multi-bit digital fault word into binary.

25. The fault communication system of claim 24, wherein a short and long duration of the logic high pulse may differentiate between a logic 0 (zero) and a logic 1 (one) in the binary multi-bit digital fault word.

26. The fault communication system of claim 21, wherein the multi-bit digital fault word comprises a 7-bit digital fault word.

27. A multiphase motor drive system, comprising:
  a multiphase motor having a plurality of phase input terminals;
  a fault bus consisting of only a single wire;
  a system controller coupled to the fault bus;
  a high voltage bus; and
  a plurality of half-bridge inverter modules coupled to the high voltage bus and the fault bus, wherein each one of the plurality of half-bridge inverter modules comprises:
  a single fault terminal coupled to the fault bus to provide multidirectional multi-fault group communication between the plurality of half-bridge inverter modules and the system controller;
  a switching block coupled to the high voltage bus, and including a high side switch coupled to a low side switch, wherein a mid-point terminal between the high side switch and the low side switch is coupled to a respective one of the plurality of phase input terminals of the multiphase motor;
  a high side control block coupled to drive the high side switch in response to high side gating signals from the system controller;
  a low side control and communication block coupled to the drive the low side switch in response to low side gating signals from the system microcontroller; and a single identification terminal configured to be in a predefined state for a respective one of the plurality of half-bridge inverter modules to uniquely identify said respective one of the plurality of half-bridge inverter modules on the fault bus.

28. The multiphase motor drive system of claim 27, wherein the multiphase motor comprises a 3-phase motor drive coupled to be driven in response to the system controller and the plurality of half-bridge inverter modules.

29. The multiphase motor drive system of claim 27, wherein the single fault terminal of each one of the plurality of half-bridge inverter module is coupled to communicate device level and system level fault information as a multi-bit digital fault word between the plurality of half-bridge inverter modules and the system controller on the fault bus.

30. The multiphase motor drive system of claim 29, wherein the predefined state for said respective one of the plurality of half-bridge inverter modules is coupled to be transmitted at a start of each fault bus communication to identify said respective one of the plurality of half-bridge inverter modules on the fault bus.

31. The multiphase motor drive system of claim 30, wherein said respective one of the plurality of half-bridge inverter modules that is identified at the start of each fault bus communication is coupled to take control of the fault bus after being identified.

32. The multiphase motor drive system of claim 27, wherein the multi-fault group communication between the plurality of half-bridge inverter modules and the system controller includes one of: an over voltage fault warning, a multi-level under voltage fault warning, a device or system level high temperature fault warning, and/or shutdown and over current fault warning in the high-side or low-side switch.

33. The multiphase motor drive system of claim 32, wherein the multi-fault group communication is coupled to be reported over the fault bus by encoding a multi-bit digital fault word to cause a control parameter change, latching, or shutdown in the system controller.

34. The multiphase motor drive system of claim 32, wherein the system controller is coupled to mutually communicate status request updates, or send unlatch commands through the fault bus.

35. The multiphase motor drive system of claim 32, wherein the device level or system level faults detected by the plurality of half-bridge inverter modules are categorized into fault groups that are reported over the fault bus, wherein a fault group may contain faults that do not occur simultaneously.

36. The multiphase motor drive system of claim 33, wherein the multi-bit digital fault word comprises pulse width modulated (PWM) logic level pulses to encode the multi-bit digital fault word into binary.

37. The multiphase motor drive system of claim 36, wherein a relatively short logic high pulse followed by a short low pulse indicate a logic zero, and wherein a relatively long logic high pulse followed by the short logic low pulse indicates a logic one in the multi-bit digital fault word.

38. The multiphase motor drive system of claim 29, wherein the multi-bit digital fault word comprises a 7-bit digital fault word.

* * * * *